(12) United States Patent
Forbes et al.

(10) Patent No.: US 7,192,827 B2
(45) Date of Patent: Mar. 20, 2007

(54) METHODS OF FORMING CAPACITOR STRUCTURES

(75) Inventors: Leonard Forbes, Corvallis, OR (US); Kie Y. Ahn, Chappaqua, NY (US); Jerome Michael Eldridge, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/755,673

(22) Filed: Jan. 5, 2001

(65) Prior Publication Data

US 2002/0090777 A1 Jul. 11, 2002

(51) Int. Cl.
*H01L 21/8242* (2006.01)

(52) U.S. Cl. ............... 438/239; 438/240; 438/253; 438/396

(58) Field of Classification Search ........... 438/239, 438/240, 253, 396, 238, 761, 768
See application file for complete search history.

(56) References Cited

U.S. PATENT DOCUMENTS

| | | | | |
|---|---|---|---|---|
| 4,214,256 A | * | 7/1980 | Dalal et al. ............. | 257/478 |
| 5,046,045 A | | 9/1991 | Miller et al. ............ | 365/145 |
| 5,198,384 A | * | 3/1993 | Dennison ................ | 438/3 |
| 5,313,101 A | * | 5/1994 | Harada et al. ........... | 257/758 |
| 5,392,189 A | | 2/1995 | Fazan et al. ............. | 361/305 |
| 5,420,070 A | * | 5/1995 | Matsuura et al. ......... | 438/625 |
| 5,563,762 A | * | 10/1996 | Leung et al. ........... | 361/301.4 |
| 5,569,614 A | * | 10/1996 | Kataoka et al. .......... | 438/571 |
| 5,605,857 A | | 2/1997 | Jost et al. ............... | 437/760 |
| 5,624,865 A | * | 4/1997 | Schuegraf et al. ........ | 438/396 |

(Continued)

FOREIGN PATENT DOCUMENTS

JP 200058777 A 2/2000

OTHER PUBLICATIONS

Choi et al. JP 2000013654 DRAM capacitor manufacturing method involves forming compound dielectric film comprising alumina layer and aluminum nitride layer, between upper and lower electrodes (Aug. 12, 1998).*
Chiu et al. TW 381343 Method for preventing dielectric cracking of capacitors by employing spacer structure to cover the shape corner at the bottom of stacked capacitor sidewall (Aug. 4, 1998).*
Abstract of: Oxidation of Sintered Aluminum Nitride at Near–ambient temperatures; Dutia, I.; Mitra, S. ; Rabenberg, L.; Journal of the American Ceramic Society, vol. 75, No. 11, pp. 3149–3153, Nov. 1992.
Abstract of: Oxidation of lead films by rf sputter etching is an oxygen plasma; J.H. Greiner.

(Continued)

*Primary Examiner*—Brook Kebede
*Assistant Examiner*—Khiem Nguyen
(74) *Attorney, Agent, or Firm*—Wells St. John, P.S.

(57) ABSTRACT

The invention includes a method of forming a capacitor structure. A first electrical node is formed, and a layer of metallic aluminum is formed over the first electrical node. Subsequently, an entirety of the metallic aluminum within the layer is transformed into one or more of AlN, AlON, and AlO, with the transformed layer being a dielectric material over the first electrical node. A second electrical node is then formed over the dielectric material. The first electrical node, second electrical node and dielectric material together define at least a portion of the capacitor structure. The invention also pertains to a capacitor structure which includes a first electrical node, a second electrical node, and a dielectric material between the first and second electrical nodes. The dielectric material consists essentially of aluminum, oxygen and nitrogen.

19 Claims, 6 Drawing Sheets

U.S. PATENT DOCUMENTS

| | | | | |
|---|---|---|---|---|
| 5,625,233 | A | * | 4/1997 | Cabral et al. ............... 257/771 |
| 5,639,316 | A | * | 6/1997 | Cabral et al. ............... 148/277 |
| 5,674,771 | A | * | 10/1997 | Machida et al. ............ 438/396 |
| 5,739,563 | A | | 4/1998 | Kawakubo et al. ......... 257/295 |
| 5,774,327 | A | | 6/1998 | Park .......................... 361/321.5 |
| 5,886,364 | A | * | 3/1999 | Zhang .......................... 257/53 |
| 5,946,571 | A | * | 8/1999 | Hsue et al. ................. 438/255 |
| 5,959,327 | A | | 9/1999 | Sandhu et al. .............. 257/310 |
| 5,963,812 | A | * | 10/1999 | Kataoka et al. ............. 438/304 |
| 5,985,731 | A | | 11/1999 | Weng et al. ................. 438/396 |
| 6,001,702 | A | | 12/1999 | Cook et al. ................. 438/393 |
| 6,083,832 | A | * | 7/2000 | Sugai .......................... 438/672 |
| 6,103,565 | A | | 8/2000 | Green et al. ................ 438/238 |
| 6,103,567 | A | | 8/2000 | Shih et al. .................. 438/251 |
| 6,107,136 | A | | 8/2000 | Melnick et al. | |
| 6,117,689 | A | * | 9/2000 | Summerfelt .................... 438/3 |
| 6,150,209 | A | * | 11/2000 | Sun et al. .................... 438/240 |
| 6,166,423 | A | * | 12/2000 | Gambino et al. ........... 257/532 |
| 6,171,970 | B1 | * | 1/2001 | Xing et al. ................. 438/706 |
| 6,187,624 | B1 | | 2/2001 | Huang ........................ 438/253 |
| 6,203,613 | B1 | | 3/2001 | Gates et al. ................ 117/104 |
| 6,246,076 | B1 | | 6/2001 | Lipkin et al. | |
| 6,277,707 | B1 | * | 8/2001 | Lee et al. .................... 438/430 |
| 6,331,460 | B1 | * | 12/2001 | Kizilyalli et al. ........... 438/243 |
| 6,337,289 | B1 | | 1/2002 | Narwankar et al. ......... 438/776 |
| 6,373,083 | B1 | | 4/2002 | Oh | |
| 6,376,355 | B1 | * | 4/2002 | Yoon et al. ................. 438/618 |
| 6,395,650 | B1 | | 5/2002 | Callegari et al. ........... 438/785 |
| 6,461,914 | B1 | | 10/2002 | Roberts et al. | |
| 6,503,810 | B2 | * | 1/2003 | Lee ............................. 438/396 |
| 6,509,280 | B2 | | 1/2003 | Choi ........................... 438/778 |
| 6,541,331 | B2 | | 4/2003 | Chudzik et al. | |
| 6,551,399 | B1 | | 4/2003 | Sneh et al. ................. 117/102 |
| 6,576,053 | B1 | | 6/2003 | Kim et al. .................... 117/89 |
| 6,580,111 | B2 | | 6/2003 | Kim et al. ................... 257/301 |
| 6,613,629 | B2 | | 9/2003 | Kim et al. | |
| 6,617,173 | B1 | | 9/2003 | Sneh | |
| 6,642,100 | B2 | * | 11/2003 | Yang et al. ................. 438/253 |
| 6,660,660 | B2 | | 12/2003 | Haukka et al. | |
| 6,664,186 | B1 | | 12/2003 | Callegari et al. ........... 438/681 |
| 6,696,332 | B2 | | 2/2004 | Visokay et al. | |
| 6,730,163 | B2 | | 5/2004 | Vaartstra | |
| 6,737,313 | B1 | | 5/2004 | Marsh et al. | |
| 6,743,475 | B2 | | 6/2004 | Sharp et al. | |
| 6,746,916 | B2 | * | 6/2004 | Agarwal et al. ............ 438/253 |
| 6,753,618 | B2 | | 6/2004 | Basceri et al. | |
| 6,780,704 | B1 | * | 8/2004 | Raaijmakers et al. ....... 438/239 |
| 6,797,525 | B2 | | 9/2004 | Green et al. .................... 438/3 |
| 7,029,985 | B2 | | 4/2006 | Basceri et al. | |
| 7,033,884 | B2 | | 4/2006 | Basceri et al. | |
| 7,053,432 | B2 | | 5/2006 | Derderian et al. | |
| 2001/0006826 | A1 | * | 7/2001 | Lee ................................ 438/3 |
| 2002/0000598 | A1 | | 1/2002 | Kang et al. | |
| 2002/0009861 | A1 | | 1/2002 | Narwankar et al. ......... 438/404 |
| 2002/0045312 | A1 | | 4/2002 | Zheng et al. | |
| 2002/0076938 | A1 | * | 6/2002 | Moradi et al. .............. 438/761 |
| 2002/0177272 | A1 | * | 11/2002 | Lee et al. .................... 438/239 |
| 2003/0052358 | A1 | | 3/2003 | Weimer | |
| 2003/0213987 | A1 | | 11/2003 | Basceri et al. | |
| 2004/0126983 | A1 | * | 7/2004 | Kim ............................ 438/396 |
| 2004/0214392 | A1 | * | 10/2004 | Nabatame et al. ........... 438/253 |
| 2004/0266217 | A1 | | 12/2004 | Kim et al. ................... 438/778 |

OTHER PUBLICATIONS

Abstract of: Josephson Tunneling Barriers by rf Sputter Etching in an Oxygen Plasma; J.H. Greiner; Journal of Applied Physics; vol. 42; No. 12; Nov. 1971.

Abstract of: Measurement of Tunnel Current Density in a Metal Oxide Metal System as a Function of Oxide Thickness; J.M. Eldridge and J. Matlsoo.

Abstract of: Optical Measurement of Film Growth on Silicon and Gernnantum Surfaces in Room Air; R.J. Archer.

Preparation of Al–O–N Films by Electron Cyclotron Resonance Plasma–Assisted Chemical Vapor Deposition; Takashi Goto; Wei Zhang; Tashie Hiral, 1999 Publication Board, Japanese Journal of Applied Physics; vol. 38 (1999) Pt. 1, No. 6A; pp. 3668–3674.

Ion assisted deposition of oxynitrides of aluminum and silicon; G.A. Al–Jumaily and T.A. Mooney; W.A. Spurgeon and H.M. Dauplaise.

Abstract of: Preparation of aluminum nitride and oxyaltride thin films by ion–assisted deposition; Targove, J.D.; Lingg, L.J.; Lehan, J.P. et al.; Conference; Materials Modification and Growth Using Ion Beams Symposium, pp. 311–16; Mater. Res. Soc., Pittsburgh, PA 1987.

Film Synthesis and Growth Using Energetic Beams; Material Research Society Symposium Proceedings vol. 388: Apr. 17–20, 1995 San Francisco, CA.

Some Properties of Chemically Vapor Deposited Films of $Al_xO_yN_z$ on Silicon; E.A. Irene, V.J. Silvestri and G.R. Woolhouse; Journal of Electronic Materials, vol. 4, No. 3, 1975; pp. 409–427.

Chemical Vapor Deposition of $Al_xO_yN_z$ Films; VJ. Silvestri, E.A. Irene, S. Zirinsky; J.D. Kuptsis; Journal of Electronic Materials, vol. 4, No. 3, 1975; pp. 429–444.

Disk hydrogen plasma assisted chemical vapor deposition of aluminum nitride; T.Y. Sheng. Z.Q. Yu, and G.J. Collins; Appl. Phys. Lett. 52(7), Feb. 1988; pp. 576–578.

Epitaxial Growth of Aluminum Nitride on Sapphire and Silicon; K. Dovidenko; S. Oktyabrsky; J. Narayan; and M. Razeghi; Mat. Res. Soc. Symp. Proc. vol. 358; 1995 Materials Research Society; pp. 1023–1028.

III–Nitride, SiC and Diamond Materials for Electronic Devices; Materials Research Society, Symposium Proceedings vol. 423; Apr. 8–12, 1996, San Francisco, CA; pp. 667–672.

Electrochemical Behaviour of AIN Films Prepared by Reactive Cathodic Sputtering; F. Vacandio, Y. Massiani, P. Gravier, L. Fedrizzi and D. Bride; Materials Science Forum; vols. 289–292 (1998) pp. 689–697; 1998 Trans Tech Publications, Switzerland.

Measurement of stress distribution in $Sl_xN_4$ using AIN thin films; M. Aklyama, C.N. Xu, K. Nonaka, T. Watanabe; Journal of Materials Science Letters (1998) pp. 2093–2095.

Changes in optical transmitance and surface morphology of AIN thin films exposed to atmosphere; Yoskihisa Watanabe, Yoshifumi Sakuragi, Yoshiki Amamote, and Yoshikazu Nakamura; J. Mater. Res., vol. 13, No. 10, Oct. 1998; 1998 Materials Research Society; pp. 2956–2961.

Optical Interference Coatings; Florin Abeles, Chair/Editor; Proceedings Europto Series; SPIE vol. 2253; part 2 of 2; pp. 1275–1285.

Tunneling Leakage Currents in Ultrathin (<4nm) Nitride/ Oxide Stack Dielectrics; Ying Shi; Xiewen Wang, T.P. Ma; IEEE Electron Device Letters, vol. 19, No. 10, Oct. 1998; pp. 388–390.

High Quality Ultra–thin (1.5 nm) $TiO_y/Si_zN_4$ Gate Dielectric for Deep Sub–micron CMOS Technology; Xia Guo, Xiewen Wang; Szijiong Luo, T.P. Ma, and T. Taxmagawa; Dept. of Electrical Engineering, Yale University, New Haven, CT 06520.

High Quality Ta$_2$O$_3$ Gate Dielectrics with T$_{zyz}$ <10Å; H. F. Luan, SJ. Lee, C.H. Lee, S.C. Song, Y.L. Moo, Y. Senzaki, D. Roberts and D.L. Kwong.

Abstract of: Low interface trap density for remote plasma deposited SiO/sub 2/ on n–type GaN: Applied Physics Letters, vol. 68, No. 13; pp. 1850–1852.

Abstract of: Interface–state characteristics of GaN/GaAs MIS capacitors; Solid–State Electroncis, vol. 25, No. 8, pp. 811–815.

Applications of Aluminum Nitride Films Deposited by Reactive Sputtering to Silicon–on–Insulator Materials; Stefan Bengtsson, Mats Bergh, Manolis Choumas, Christian Olesen and Kjell O. Jeppson; Jpn. J. Appl. Phys. vol. 35 (1996) Pt. 1, No. 8; pp. 4173–4181.

Characteristics of AlN Thin Films Deposited by Electron Cyclotron Resonance Dual–Ion–Beam Sputtering and their Application to Ghz–Bank Surface Acoustic Wave Devices: Hiroshi Okamo, Naoki Tanaka, Yasuhiro Hirao, Yasumi Kobayashi, Kenichi Shibaia and Shoichi Nakono; Jpn. J. Appl. Phys. vol. 33 (1994); Pt. 1. No. 5B; pp. 2957–2961.

An Aluminum Oxynitride Film; Wang Dehuang. Guo Liang: Thin Solid Films, 198 (1991) pp. 207–210.

Formation of aluminum oxynitride diffusion barriers for Ag metallization; Y. Wang and T. L. Alfond; Applied Physics Letters; vol. 74, No. 1; 4 Jan. 1999; American Institute of Physics; pp. 52–54.

Abstract of; Simulation of Hyperthermal deposition of Si and C on SiC surfaces: Applied Physics Letters; vol. 74, No. 1; Jan. 4, 1999; 1999 American Institute of Physics.

Nitrogen plasma source ion implantation for corrosion protection of aluminum 6061–T4; J. H. Booske, L. Zhang, W. Wang, K. Mentie, N. Zjaba, C. Baum, and J.L. Shahei; J. Mater. Res. vol. 12, No. 5, May 1997; 1997 Materials Research Society; pp. 1356–1366.

Thickness measurement of submonolayer native oxide films on silicon wafers; Fuhe Li, Marjorie K. Balazs, Bruce E. Deal; Wafers & Substrates: Solid State Technology, Feb. 2000; pp. 87, 88, 92, 94, 96, 98.

Electrical Conduction and Dielectric Breakdown in Aluminum Oxide Insulators on Silicon; James Kolodzey et al.; IEEE Transactions on Electron Devices; vol. 47, No. 1, Jan. 2000; pp. 121–128.

Structural, Optical and Electronic Properties of Oxidized AlN Thin Films at Different Temperatures: Enam Ahmed Chowdhury et al.;.

Formation of Al–nitride films at room temperature by nitrogen ion implantation into aluminum; N. Lieske and R. Hezel; J. Appl. Phys. 52(9), Sep. 1981; pp. 5806–5810.

S. Ogawa, et al., *Silicon–Aluminum Oxynitride Composite Films Deposited by Reactive Ion Beam Sputtering.* IEEE 1999, pp. 775–778.

* cited by examiner

_Fig. 11_

METHODS OF FORMING CAPACITOR STRUCTURES

TECHNICAL FIELD

The invention pertains to methods of forming capacitor structures, and also pertains to capacitor structures.

BACKGROUND OF THE INVENTION

As silicon device sizes becoming increasingly smaller, and as a minimum feature size of CMOS devices approaches and goes below the 0.1 micrometer regime, very thin gate insulators can be required to keep the capacitance of a dynamic random access (DRAM) capacitor cell in a 30 femtofarad (fF) range. For instance, if insulators are formed of silicon dioxide, it can be necessary to keep the insulators to a thickness of less than 2 nanometers (20 Å), and possibly even as thin as 1 nanometer (10 Å). Further, even if the insulating material is kept to a suitable thickness, it can be required to form a very high aspect ratio, or very tall polysilicon capacitor structure, to achieve a desired capacitance in the range of 30 fF.

A commonly-used dielectric material is silicon dioxide ($SiO_2$). However, thin layers of silicon dioxide can have high leakage current density due to direct band-to-band tunneling current or Fowler-Nordheim tunneling current. Accordingly, high-k (dielectric constant) films such as $TiO_2$, $Ta_2O_5$, and $Al_2O_3$ have received interest as being possible substitutions for silicon dioxide as dielectric materials in DRAM capacitors. The higher dielectric constants of high-k materials can allow the use of thicker insulators, which can have orders of magnitude less tunneling current than a thin insulator while still yielding the same capacitance value as the thin insulator.

A difficulty with the utilization of high dielectric constant insulating materials is that the materials can have poor interface characteristics with silicon, and a high density of interface states. Such interface states can cause poor reliability of a capacitor structure, in that they can charge with time under use conditions. The resulting electric fields can cause breakdown of the thin dielectric insulators.

Among the materials which may have application as substitute dielectric materials for DRAM capacitors are aluminum oxide, aluminum nitride, and aluminum oxynitride. Such materials can be referred to herein as AlO, AlN and AlON, respectively, with it being understood that the compounds are described in terms of chemical constituents rather than stoichiometry. Accordingly, even though aluminum oxide can be described herein as being AlO, the material would typically be in the form of $Al_2O_3$, and the designation AlO used herein indicates that the material comprises chemical constituents of aluminum and oxygen, rather than indicating a particular stoichiometry of such constituents.

Several pertinent physical characteristics of AlO, AlN and AlON are as follows. First, aluminum oxide is a direct band gap insulator with a band gap of 7.6 eV and a dielectric constant of from about 9 to about 12, depending upon whether the material is amorphous or crystalline. If the material is crystalline, the crystallographic orientation can also affect the dielectric constant. Aluminum nitride has a band gap of 6.2 eV, and amorphous aluminum nitride has a dielectric constant of from about 6 to about 9.6.

Work performed with AlN gate insulators indicates that AlN can be used as a gate insulator in MIS C-V structures on GaAs and silicon. Further, it has been shown that the deposited AlN films can be oxidized to form an aluminum oxide layer. Such oxidation can fill pin holes in the gate insulator to avoid shorted device structures, in a similar way that SiON insulators can be utilized in conventional DRAM capacitor cells.

Aluminum nitride films can be grown epitaxially on silicon utilizing metal organic chemical vapor deposition (MOCVD). Alternatively, aluminum nitride films can be deposited by RF magnetron sputtering. Regardless of how the aluminum nitride films are formed, they can subsequently be oxidized by, for example, exposing the films to oxygen at a temperature of from about 800° C. to about 1,000° C. for a time of from about one hour to about four hours. The aluminum nitride films can be oxidized either partially or fully into $Al_2O_3$, depending on the initial thickness of the films, the oxidation temperature, and the time of exposure to the oxidation temperature.

The above-described methods for deposition of aluminum nitride would typically be considered to be high temperature methods, and would utilize temperatures of 1000° C. or greater. Processes have also been developed for deposition of aluminum nitride films which utilize temperatures of less than 1000° C. Such processes comprise nitrogen implantation into aluminum films, and can, for example, utilize ion beams of nitrogen having beam energies in the range of 200 eV to 6 keV, and current densities up to 50 $\mu A/cm^2$. Such densities can be produced by a Penning, source type ion gun with a magnetic lens. Also, aluminum nitride can be formed by MOCVD, or by electron cyclotron resonance (ECR) dual-ion-beam sputtering, as well as by ion-beam assisted deposition (IBAD) using, a nitrogen ion beam energy of 0.1 keV, 0.2 keV, or 1.5 keV. Still other methods for deposition of aluminum nitride films include low-voltage ion plating, with reactive DC-magnetron sputtering, and reactive sputtering.

Aluminum oxynitride can also be deposited by processes utilizing temperatures of less than 1000° C. For instance, aluminum oxynitride can be chemical vapor deposited utilizing $AlCl_3$, $CO_2$ and $NH_3$ as reactive gases in a nitrogen carrier, with the films grown from the mixed gases at a temperature of, for example, from 770° C. to 900° C. Further, aluminum oxynitride films can be grown by electron cyclotron resonance plasma-assisted chemical vapor deposition.

Studies indicate that thin films of aluminum nitride, aluminum oxynitride, and aluminum oxide can be deposited by evaporation of aluminum nitride and simultaneous bombardment with one or both of nitrogen and oxygen. Also, aluminum nitride and aluminum oxynitride films have been prepared by ion assisted deposition, in which aluminum was electron-beam evaporated on a substrate with simultaneous nitrogen ion bombardment. Aluminum oxynitride films can also be formed by planar magnetron sputtering from an alumina target in a mixture of nitrogen and oxygen, and can be formed by reactive RF sputtering in a mixture of $N_2$ and $O_2$. Also, aluminum oxynitride diffusion barriers have been formed in a temperature range of from about 400° C. to about 725° C. by annealing silver/aluminum bi-layers on silicon dioxide substrates in an ammonia ambient.

Finally, aluminum nitride can be formed by plasma nitridation of metallic aluminum. The aluminum nitride can then be converted to aluminum oxide, or aluminum oxynitride, by exposure of the aluminum nitride to an oxygen plasma.

Aluminum nitride films have previously been grown on aluminum films by RF sputter etching the metallic aluminum films in an ammonia-rare gas plasma at temperatures near room temperature under relatively modest applied plasma voltages. The technique has been used to form oxide tunnel barriers on superconducting metals for Josephson devices. The process essentially uses the plasma to generate reactive ions which then interact with a metallic surface to form an oxide film. Electric fields and ionic charges can be present which can control and accelerate ion migration across a developing oxide film, with the thickness of the oxide film increasing as a logarithm of reaction time. A steady, slow rate of physical sputtering can be maintained by utilizing bombardment with inert gas ions such that the growing oxide plateaus in thickness. The particular thickness can depend on the oxide properties and the plasma conditions. The plateau value can be reached by using parametric values to grow a given thickness, and/or by growing the thickness to a value greater than a desired thickness and then subsequently restoring parameters which reduce the thickness to the desired thickness. The oxide films formed by such procedures can be exceptionally uniform in thickness and other properties.

It is possible to extend RF sputter etching techniques to formation is of aluminum nitride at temperatures of less than 200° C. by utilizing an ammonia reacting gas rather than diatomic nitrogen ($N_2$). The ammonia can yield charged ions, while diatomic nitrogen produces neutrals whose diffusion through nitride is unaided by the field across the nitride. The concentration of charged ions produced in plasmas containing ammonia gas can be much smaller than the concentration of charged oxygen ions produced in an oxygen-containing plasma. Accordingly, it can be desired to preclude oxygen from a nitridation plasma if it is desired to avoid forming dielectric films comprised predominantly of oxygen anions. On the other hand, if it is desired to form a film comprising aluminum oxynitride, it will be desired to introduce oxygen in addition to the nitrogen. One method of introducing oxygen in a low dose is to introduce the oxygen in the form of $N_2O$.

SUMMARY OF THE INVENTION

In one aspect, the invention encompasses a method of forming a capacitor structure. A first electrical node is formed, and a layer of metallic aluminum is formed over the first electrical node. Subsequently, an entirety of the metallic aluminum within the layer is transformed into one or more of AlN, AlON, and AlO, with the transformed layer being a dielectric material over the first electrical node. A second electrical node is then formed over the dielectric material. The first electrical node, second electrical node and dielectric material together define at least a portion of the capacitor structure.

In another aspect, the invention encompasses a capacitor structure which includes a first electrical node, a second electrical node, and a dielectric material between the first and second electrical nodes. The dielectric material consists essentially of aluminum, oxygen and nitrogen.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention encompasses new processes for forming capacitor structures wherein low-temperature processing is utilized to form one or more of aluminum nitride, aluminum oxynitride, or aluminum oxide within a dielectric material between two capacitor plates. The low temperature processing comprises forming a metallic layer of aluminum, and subsequently converting the metallic layer to one or more of aluminum nitride, aluminum oxynitride, or aluminum oxide. For purposes of interpreting this disclosure and the claims that follow, "low temperature" processing is to be understood as processing occurring at less than or equal to 200° C.

Low temperature processing can provide numerous advantages for formation of semiconductor device structures. For instance, studies indicate that there is a tendency for fixed charges and fast states to develop on or within a few angstroms of an aluminum nitride/silicon interface, which can introduce some instabilities in the MIS electrical characteristics and long-term stabilities. At least some of the slow and fast states are attributable to the use of excessively high aluminum nitride deposition temperatures, characteristic of, for example, CVD processes. Such temperatures can allow for intermixing of components at the interface, doping of the silicon with aluminum, and even some formation of aluminum silicides. Forming aluminum nitride temperatures under 300° C. may serve to mitigate this problem, in that the diffusion co-efficient of aluminum in silicon is roughly $10^{-24}$ cm²sec⁻¹. Accordingly, aluminum penetration into silicon at temperatures of about 300° C. or below for exposure times of about 10,000 seconds will amount to only a small fraction of an angstrom diffusion distance. Further, penetration can be orders of magnitude less at temperatures of around 100° C. to about 200° C. Accordingly, it can be possible to avoid autodoping; and maintain a clean, sharp interface if aluminum nitride, aluminum oxynitride and/or aluminum oxide can be formed at temperatures of less than or equal to 200° C. Further, if plasmas can be avoided, it can be possible to avoid driving ions from a plasma into a silicon substrate.

Figure 1:
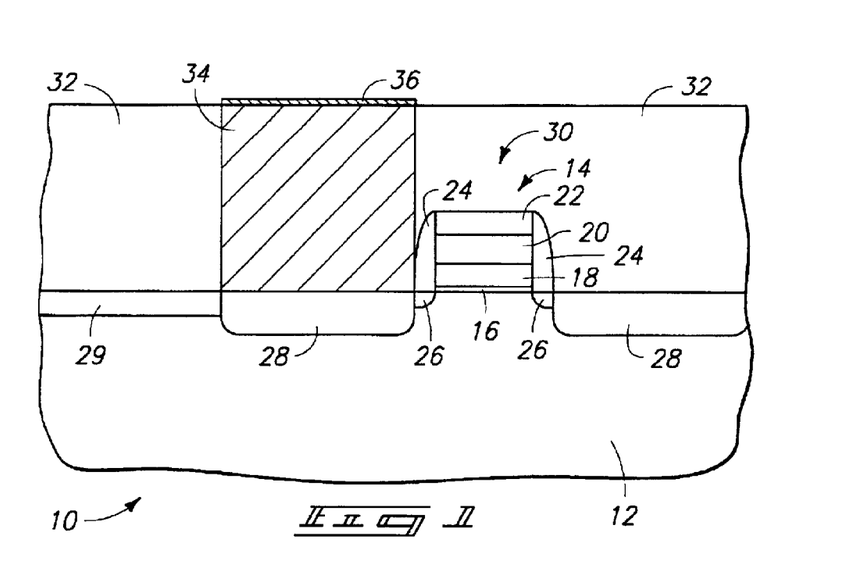
FIG. 1 is a diagrammatic, cross-sectional view of a semiconductor wafer fragment at a preliminary processing step of a method of the present invention.

An exemplary method of the present invention is described with reference to FIGS. 1–4. Referring initially to FIG. 1, a semiconductor wafer fragment 10 is illustrated at a preliminary processing step of a method of the present invention. Semiconductor wafer fragment 10 comprises a substrate 12 which can comprise, for example, monocrystalline silicon lightly-doped with a background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A transistor gate 14 is shown formed over substrate 12. Gate 14 comprises a pad oxide layer 16, a conductively doped silicon layer 18, a silicide layer 20, and an insulative material 22. Pad oxide 16 can comprise, for example, silicon dioxide; silicon layer 18 can comprise, for example, polycrystalline silicon conductively doped with either an n-type or p-type dopant; silicide 20 can comprise, for example, tungsten silicide or titanium silicide; and insulative material 22 can comprise, for example, silicon nitride or silicon dioxide.

Sidewall spacers 24 are shown formed along sidewalls of gate 14, and can comprise, for example, silicon dioxide or silicon nitride. Conductively-doped regions 26 and 28 are shown provided within substrate 12 and adjacent transistor gate 14. Conductively-doped regions 26 can be lightly doped and can correspond to, for example, lightly doped diffusion regions; while regions 28 can be more heavily doped, and can correspond to heavily doped source/drain regions. Regions 26 and 28 can be conductively doped with either n-type or p-type dopant. Gate 14 and doped regions 26 and 28 together define a transistor structure 30.

An isolation region 29 is adjacent one of the source/drain regions 28. Isolation region 29 can comprise, for example, silicon dioxide, and can correspond to a shallow trench isolation region.

An insulative material 32 is shown formed over substrate 12 and transistor structure 30. Insulative material 32 can comprise, for example, borophosphosilicate glass (BPSG). Further, insulative material 32 can comprise multiple insulative materials, such as, for example, an underlying layer of chemical vapor deposited silicon dioxide and an upper layer of BPSG, even though layer 32 is illustrated in FIG. 1 as being a single material layer.

An opening has been formed through insulative material layer 32 to one of the source/drain regions 28, and subsequently filled with a conductive material 34. Conductive material 34 can comprise, for example, a metal and/or a conductively doped silicon. In particular embodiments, conductive material 34 comprises conductively-doped polycrystalline silicon. The polycrystalline silicon can be conductively-doped with either n-type or p-type dopant. Conductive material 34 ultimately comprises a first electrical node of a capacitor structure. Although conductive material 34 is shown with a planar upper surface, it is to be understood that conductive material 34 can have a roughened surface, such as, for example, a surface of hemispherical grain polysilicon. Also, although conductive material 34 is shown as a plug, it is to be understood that conductive material 34 can have other shapes, such as, for example, a container shape.

A Metallic aluminum layer 36 is shown formed over conductive material 34. Metallic aluminum layer 36 can be formed by, for example, ion-assisted deposition of aluminum. Layer 36 preferably has a thickness of from greater than 0 Å to about 40 Å and can, for example, comprise a thickness of from about 5 Å to about 15 Å. The thickness of aluminum layer 36 can be controlled to within about 1 Å. Residual surface oxides (not shown) can be removed from over an upper surface of conductive material 34 prior to formation of metallic aluminum material 36 utilizing, for example, a low-voltage sputter etching treatment.

Layer 36 is shown patterned to be provided only over conductive material 34, and not over insulative material 32. Such patterning can be accomplished by, for example, selective deposition of material 36 only over conductive material 34, or by patterning layer 36 after non-selective deposition. The patterning of non-selectively deposited material 36 can be accomplished by, for example, forming a patterned photoresist block (not shown) over a portion of material 36 that is on conductive material 34, while leaving other portions of material 36 not covered by the photoresist block, and subsequently etching the uncovered portions of material 36. The photoresist block can then be removed to leave the structure shown in FIG. 1.

Figure 2:
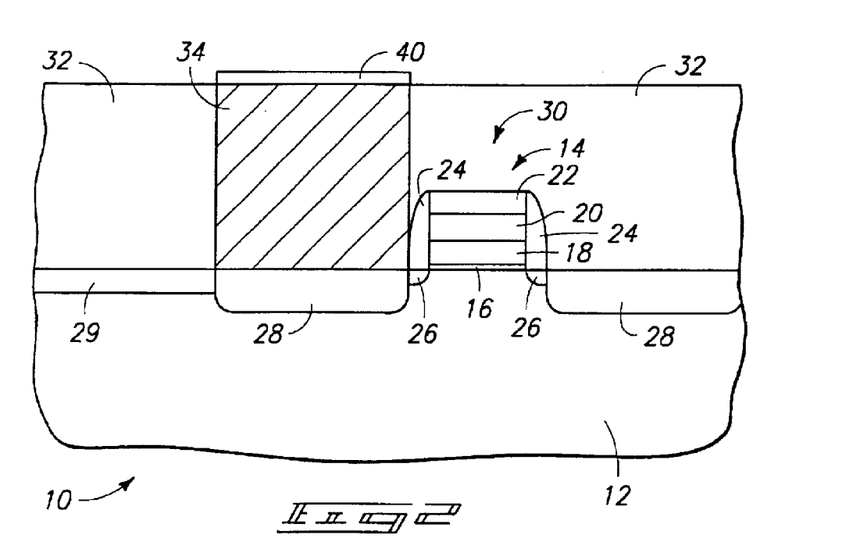
FIG. 2 is a view of the FIG. 1 wafer fragment shown at a processing step subsequent to that of FIG. 1.

Referring next to FIG. 2, wafer fragment 10 is shown after metallic aluminum layer 36 (FIG. 1) is exposed to conditions which convert the metallic aluminum to a dielectric material 40. Such conditions can convert layer 36 to one or more aluminum oxide, aluminum oxynitride, or aluminum nitride. Preferably, the conditions will comprise low-temperature transformation of material 36, with low-temperature being defined as a temperature less than or equal to 200° C. Utilization of low-temperature transformation can avoid exposure of the doped regions 26 and 28, or other doped regions associated with substrate 10, to excessive temperatures which could cause undesired diffusion of dopant from the doped regions to adjacent regions.

A thickness of dielectric material 40 can be determined from a starting thickness of metallic aluminum layer 36 (FIG. 1) as well as by the type of dielectric material ultimately formed. For instance, if the dielectric material is aluminum nitride, then a starting thickness of metallic aluminum layer 36 of about 20 Å will yield a thickness of dielectric material 40 of from about 28.5 Å to about 31.5 Å, assuming that the metallic aluminum is entirely reacted. The metallic aluminum of layer 36 can be converted to dielectric material 40 by one or more of the methods described in the "Background" section of this disclosure, including, for example, exposing layer 36 to reactive RF sputtering in an ammonia/$N_2O$ mixture; reactive RF sputtering of the aluminum in a $N_2/O_2$ mixture; reactive RF sputtering of the aluminum in a $O_2$ or a $CO_2$ environment to form aluminum oxide; nitrogen implantation into the metallic aluminum to form aluminum nitride; and electron cyclotron resonance plasma-assisted chemical vapor deposition utilizing $N_2O/$ N₂. An exemplary process can utilize RF nitridation to form aluminum nitride from the metallic aluminum. Specifically, a substrate can be maintained at a temperature of about 25° C. and can be exposed to plasma for a time of from about 10 minutes to about 20 minutes. A feed gas to the plasma can comprise at least 90% ammonia (by volume) and the remainder argon. The plasma can have a dynamic plasma pressure of about $10^{-2}$ torr, and can be maintained with a potential to an RF cathode plate of from about 300 volts to about 400 volts.

In the shown embodiment, an entirety of metallic aluminum of layer 36 (FIG. 1) is converted to dielectric material 40. Such dielectric material can consist essentially of, or consist of, aluminum nitride (AlN), aluminum oxynitride (AlON), or aluminum oxide (AlO) (with the listed compounds being described in terms of chemical constituents rather than stoichiometry). The dielectric material 40 can comprise a thickness of, for example, from greater than 0 Å to less than 40 Å, such as, for example, a thickness of from 5 Å to 15 Å, or a thickness of from 20 Å to 40 Å, or a thickness of from 10 Å to 20 Å. The desired thickness can depend on the dielectric constant of the dielectric material 40, and on a desired capacitance of a capacitor structure ultimately formed to comprise dielectric material 40. For instance, it can be desired that the thickness of aluminum oxynitride or aluminum nitride be from 10 Å to 20 Å for a DRAM capacitor having capacitance in a 30 fF range. The relative dielectric constants of various materials are such that a layer of AlN can be twice as thick as a layer of $SiO_2$ and have about the same capacitance. Also, a layer of AlON can be twice as thick as a layer of $SiO_2$ and have about the same capacitance. Further, a material comprising a layer of AlON on a layer of AlN can be twice as thick as a layer of $SiO_2$ and have about the same capacitance. Additionally, a material comprising a layer of AlN on a layer of $SiO_2$ can be one and one-half times as thick as a material consisting of $SiO_2$ and have about the same capacitance.

Figure 3:
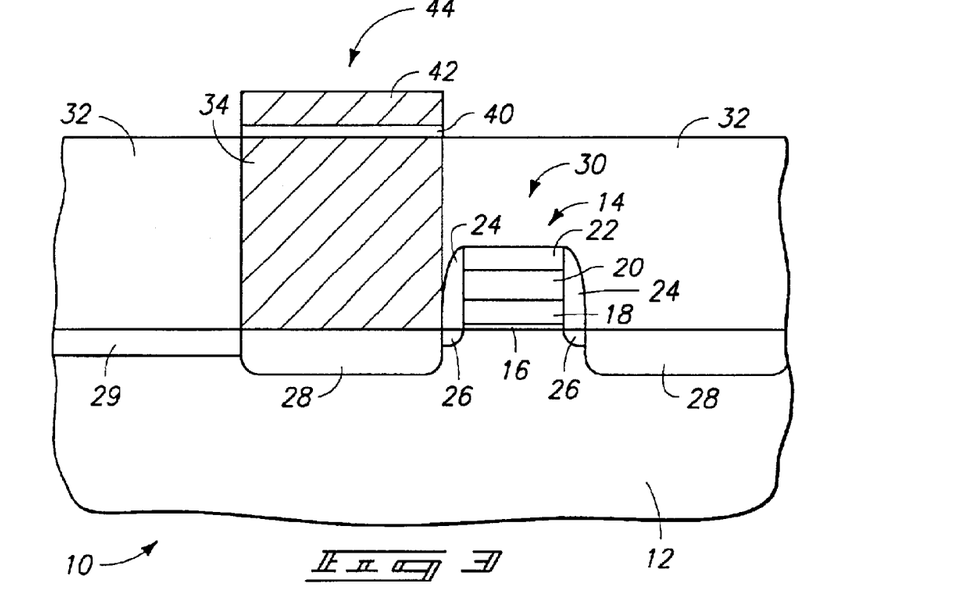
FIG. 3 is a view of the FIG. 1 wafer fragment shown at a processing step subsequent to that of FIG. 2.

Referring to FIG. 3, a conductive material 42 is formed over dielectric material 40. Conductive material 42 can comprise, for example, conductively doped silicon, and/or a metal. In the shown embodiment, conductive material 42 is illustrated as being patterned to have sidewalls coextensive with sidewalls of dielectric material 40. Such can be accomplished by, for example, forming conductive material 42 to extend past sidewalls of dielectric material 40, subsequently patterning conductive material 42 with photoresist (not shown), followed by an appropriate etch of conductive material 42. In alternative embodiments (not shown), conductive material 42 can be formed to extend beyond sidewalls of dielectric material 40 to define a capacitor plate which extends across several capacitor structures. Conductive material 42 defines a second electrical node which is spaced from first electrical node 34 by dielectric material 40. Accordingly, conductive material 42 is capacitively coupled with conductive material 34 through dielectric material 40; and materials 34, 40 and 42 together define a capacitor structure 44. Dielectric material 40 can be considered to define a dielectric region operatively positioned between electrical nodes 34 and 42 in the capacitor construction 44 of FIG. 4.

Figure 4:
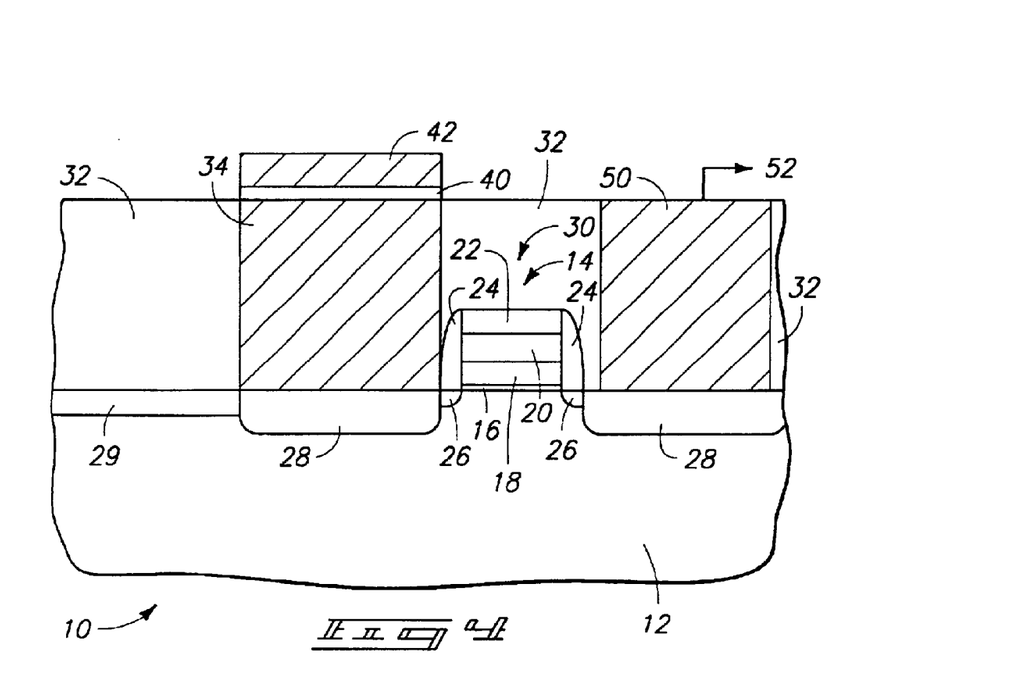
FIG. 4 is a view of the FIG. 1 wafer fragment shown at a processing step subsequent to that of FIG. 3.

Referring next to FIG. 4, a conductive interconnection 50 is formed to extend through insulative material 32 and to a source/drain region 28 associated with transistor device 30. Interconnect 50 can comprise a bit line interconnect, and accordingly can be connected to a bit line 52. Accordingly, transistor 30 and capacitor 44 can comprise a DRAM memory cell connected to a bit line, and forming a portion of a memory array.

Figure 5:
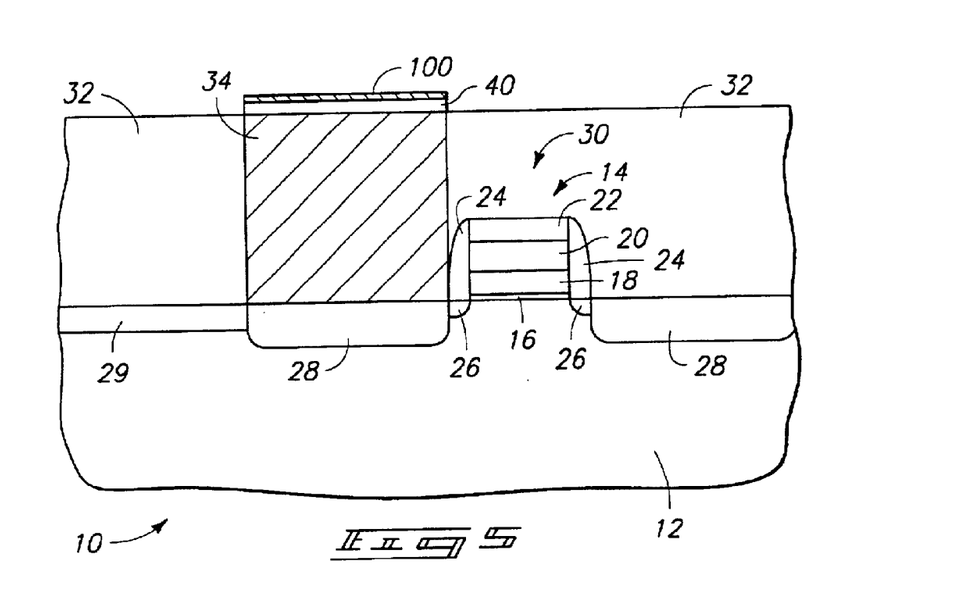
FIG. 5 is a view of the FIG. 1 wafer fragment shown at a processing step subsequent to that of FIG. 2, and shown in accordance with a second embodiment method of the present invention.
Figure 6:
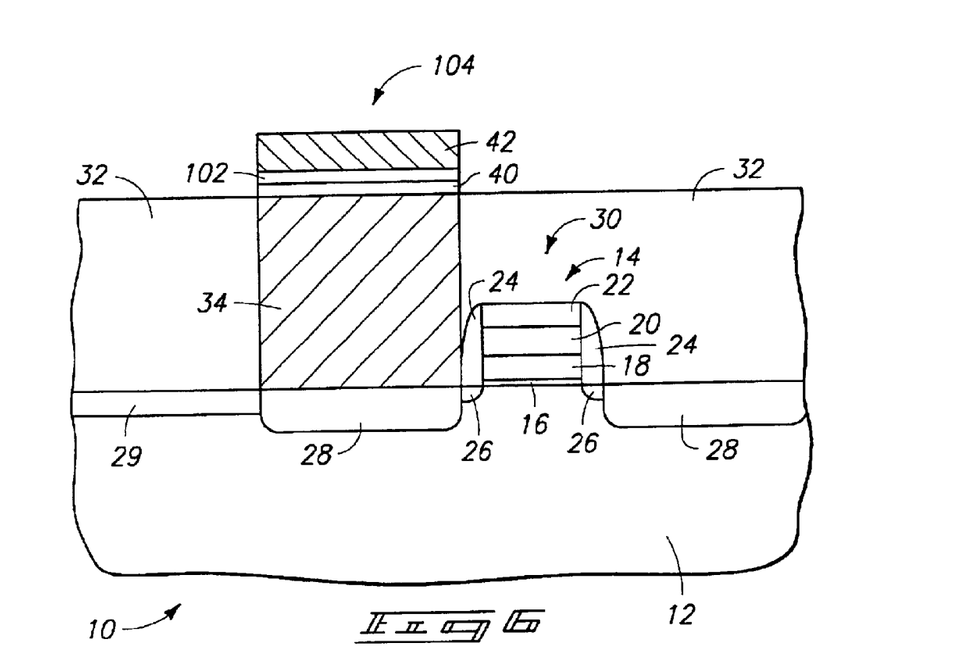
FIG. 6 is a view of the FIG. 1 wafer fragment shown at a processing step subsequent to that of FIG. 5 in accordance with the second embodiment method of the present invention.

FIGS. 5 and 6 illustrate an alternative embodiment of the present invention. Referring initially to FIG. 5, wafer fragment 10 is illustrated at a processing step subsequent to that of FIG. 2, and is shown comprising a metallic aluminum layer 100 formed over dielectric material 40. Metallic aluminum layer 100 can be formed utilizing methodology described above for formation of metallic aluminum layer 36 of FIG. 1.

Referring to FIG. 6, aluminum layer 100 (FIG. 5) is converted to a dielectric material 102. Such conversion can comprise methodology similar to that described above with reference to FIG. 2 for formation of dielectric material 40 from metallic aluminum layer 36. Accordingly, dielectric material 102 can comprise one or more of aluminum oxide, aluminum nitride, or aluminum oxynitride. In particular embodiments, dielectric material 40 will comprise aluminum nitride and dielectric material 102 will comprise aluminum oxide. The aluminum nitride can have a thickness of, for example, from about 10 Å to about 20 Å, and the aluminum oxide can have a thickness of, for example, from about 10 Å to about 20 Å.

A conductive material 42 (which can be identical to described with reference to FIG. 3) is formed over dielectric material 102 to define a capacitor structure 104 comprising electrically conductive materials 34 and 42, as well as dielectric materials 40 and 102. A difference between the capacitor structure 104 of FIG. 6 and the capacitor structure 44 of FIG. 3 is that conductive material 42 is spaced from first dielectric material 40 by second dielectric material 102 in the construction of FIG. 6, whereas in the construction of FIG. 3 the conductive material 42 is on the dielectric material 40. A similarity between the capacitor 8 constructions 44 of FIG. 3 and 104 of FIG. 6 is that both constructions can comprise a dielectric material 40 comprising aluminum, oxygen and nitrogen on a conductive material 34. Capacitor construction 104 can be incorporated into a DRAM cell utilizing processing similar to that described above with reference to FIG. 4. Dielectric materials 40 and 102 can be considered to together define a dielectric region operatively positioned between electrical nodes 34 and 42 in the capacitor construction 104 of FIG. 6.

Figure 7:
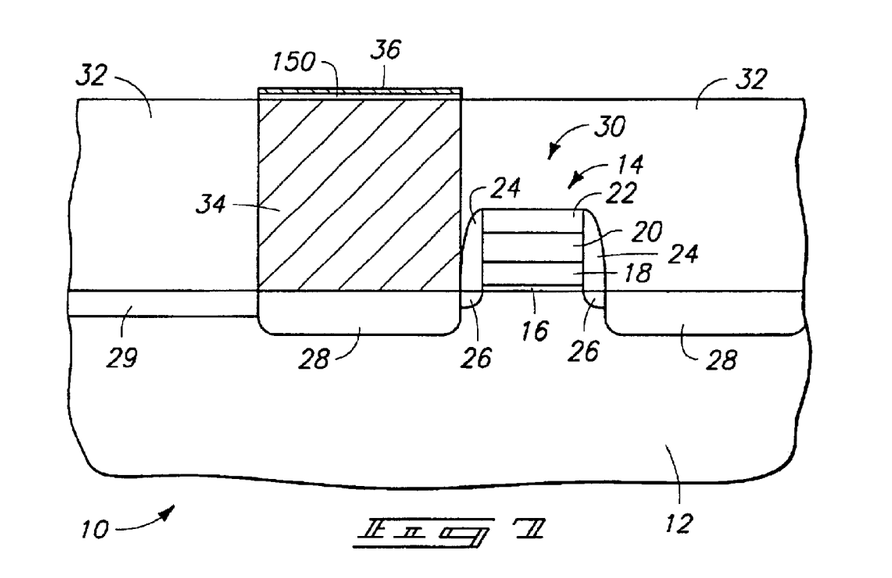
FIG. 7 is a diagrammatic, cross-sectional view of a semiconductor wafer fragment at a preliminary processing step of a third embodiment method of the present invention, and shown with numbering identical to that utilized in describing the embodiment of FIGS. 1–4.

Another embodiment of the invention is described with reference to FIGS. 7 and 8. Referring initially to FIG. 7, wafer fragment 10 is shown at a processing step which is alternative to that of FIG. 1. Specifically, wafer fragment 10 is shown comprising a silicon dioxide layer 150 formed over conductive material 34 prior to formation of metallic aluminum layer 36. Silicon dioxide layer 150 can be formed by, for example, oxidation of an upper surface of a silicon-comprising material 34, or by chemical vapor deposition of silicon dioxide over material 34. It has been found that aluminum does not react or diffuse into clean, high-quality silicon dioxide at temperatures below 500° C., and that even at 500° C., an aluminum-silicon reaction is not detected regardless of whether there is significant amounts of water vapor, and regardless of whether the exposure time is for several hours. Accordingly, it is reasonable to deposit a controlled thickness of aluminum over a controlled thickness of thermally grown silicon dioxide, and yet to avoid interaction of the two materials.

It can be desired that a thickness of oxide material 150 be carefully controlled, and such preferably comprises utilization of methodology wherein any water utilized during formation of oxide layer 150 is ultra-pure water.

Oxide layer 150 can be formed to a controlled thickness by carefully growing the oxide layer to a desired thickness.

Alternatively, oxide layer 150 can be grown beyond a desired thickness, and then carefully etched back to a desired thickness. One method for etching back an oxide is to utilize an inductively coupled plasma optical emissions spectroscopy technique, which can permit detection and determination of variations in oxide thickness to within a monolayer, and possibly to within 0.2 Å.

Silicon dioxide layer 150 preferably has a thickness of from greater than 0 Å to less than about 15 Å, and a thickness of about 10 Å can be preferred.

Figure 8:
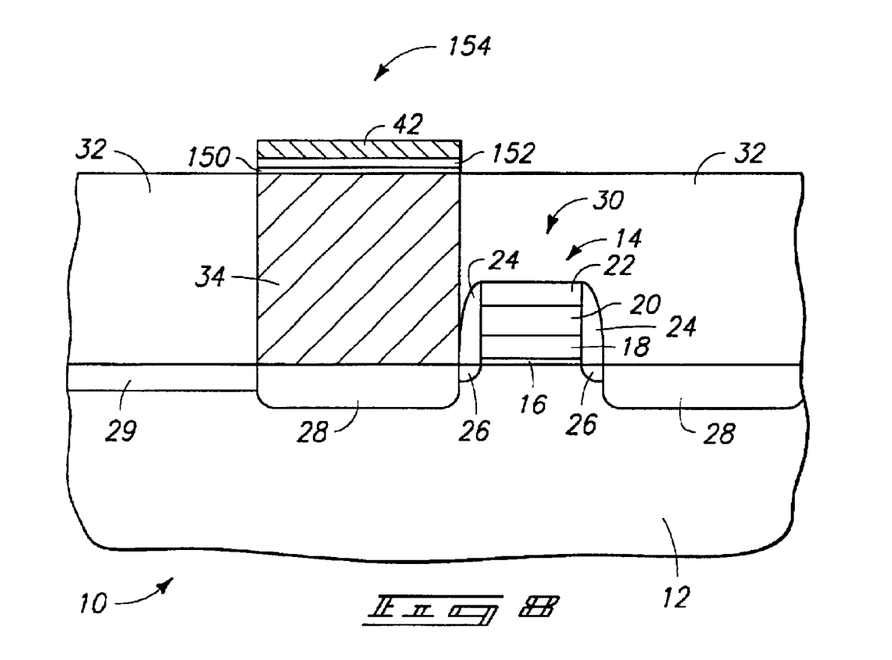
FIG. 8 is a view of the FIG. 7 wafer fragment shown at a processing step subsequent to that of FIG. 7 in accordance with the third embodiment method of the present invention.

Referring to FIG. 8, metallic aluminum layer 36 (FIG. 7) is converted to a dielectric material 152. Such conversion can comprise, for example, exposing metallic aluminum layer 36 to conditions similar to those discussed above with reference to FIG. 2 to form dielectric material layer 152 to comprise one or more of aluminum nitride, aluminum oxide, or aluminum oxynitride. In an exemplary process, dielectric layer 152 can comprise aluminum oxynitride, and can be formed to a thickness of from about 20 to 40 Å, and silicon dioxide layer 150 can comprise a thickness of from about 5 Å to about 15 Å, with a preferred thickness being about 10 Å. In other exemplary processing, dielectric material 152 can consist essentially of, or consist of aluminum nitride, and can be formed to a thickness of, for example, from about 20 Å to about 40 Å, and silicon dioxide 150 can be formed to a thickness of from about 5 Å to about 15 Å, with about 10 Å being a preferred thickness.

Conductive material 42, dielectric materials 150 and 152, and conductive material 34 together define a capacitor construction 154. Capacitor construction 154 can be incorporated into a DRAM cell utilizing methodology similar to that discussed above with reference to FIG. 4. Dielectric materials 150 and 152 can be considered to together define a dielectric region operatively positioned between electrical nodes 34 and 42 in the capacitor construction 154 of FIG. 8.

Figure 9:
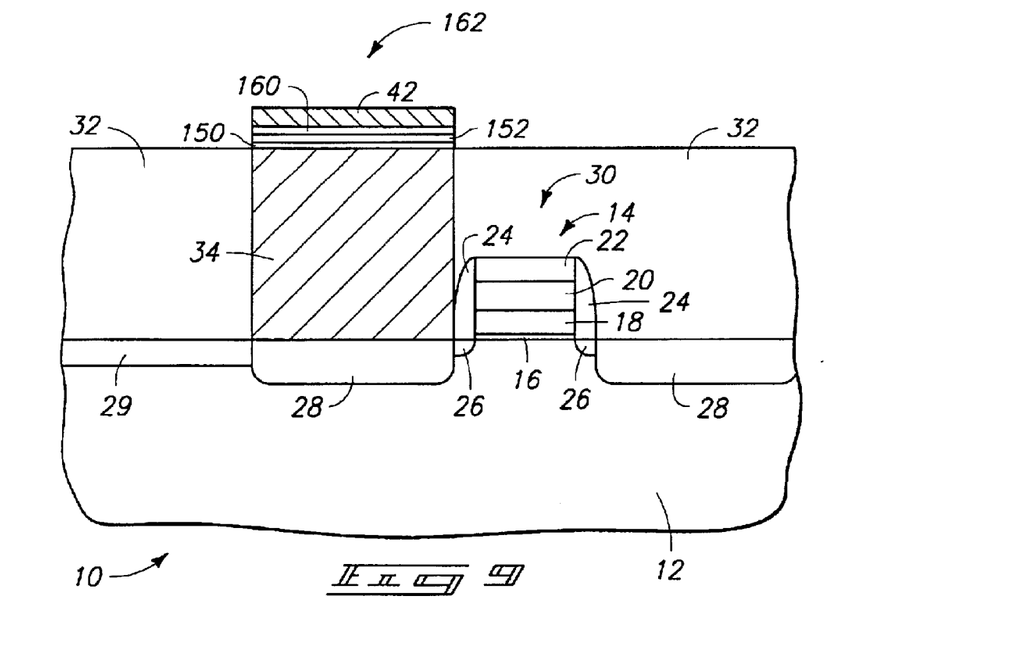
FIG. 9 is a view of the FIG. 7 wafer fragment shown at a processing step subsequent to that of FIG. 7 in accordance with a fourth embodiment method of the present invention.

FIG. 9 illustrates yet another embodiment of the present invention, and specifically illustrates that the methodology of FIGS. 7 and 8 can be combined with that of FIGS. 5 and 6. FIG. 9 illustrates wafer fragment 10 comprising a capacitor structure 162 which incorporates three dielectric material layers 150, 152 and 160. Dielectric material layers 150 and 152 can be formed by the processing described above with reference to FIGS. 7 and 8. Dielectric material 160 can be formed by forming a metallic aluminum layer over dielectric material 152, and subsequently converting the metallic aluminum layer to a dielectric material. Such can be conducted analogously to the processing described with reference to FIGS. 5 and 6 wherein a metallic aluminum layer 100 is formed over a dielectric material 40 and subsequently converted to a dielectric material 102. Accordingly, dielectric material 160 of FIG. 9 can comprise aluminum oxide, aluminum nitride or aluminum oxynitride, and in particular embodiments can consist of, or consist essentially of aluminum oxide, aluminum nitride or aluminum oxynitride. In particular methodology, dielectric material 150 can consist of silicon dioxide, dielectric material 152 can consist of aluminum nitride, and dielectric material 160 can consist of aluminum oxide. In such embodiment, silicon dioxide material 150 can have a thickness of from about 5 Å to about aluminum nitride material 152 can have a thickness of from about 5 Å to about 15 Å, and aluminum oxide material 160 can have a thickness of from about 5 Å to about 15 Å, with exemplary thicknesses of materials 150, 152 and 160 being about 10 Å each. Dielectric materials 150, 152 and 160 can be considered to together define a dielectric region operatively positioned between electrical nodes 34 and 42 in the capacitor construction 162 of FIG. 9.

The capacitor structure 162 of FIG. 9 can be incorporated into a DRAM cell utilizing methodology similar to that discussed above with reference to FIG. 4.

Figure 10:
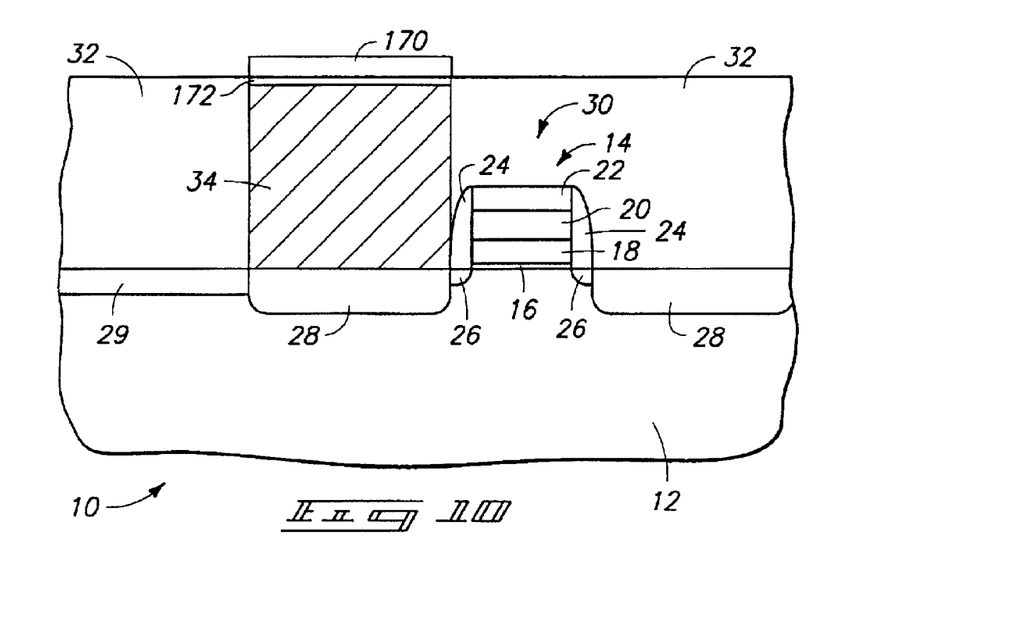
FIG. 10 is a view of the FIG. 1 wafer fragment shown at a processing step subsequent to that of FIG. 1, and shown in accordance with a fifth embodiment method of the present invention.

FIG. 10 illustrates yet another embodiment of the present invention, and shows wafer fragment 10 at a processing step subsequent to that of FIG. 1. Specifically, a metallic aluminum layer 36 of FIG. 1 has been transformed to a dielectric material 170 analogously to the formation of dielectric material 40 of FIG. 2. However, in contrast to the processing described above with reference to FIG. 2, the formation of dielectric material 170 has caused formation of a silicon dioxide layer 172 under dielectric material 170. Such can occur if dielectric material 170 comprises aluminum oxide or aluminum oxynitride, and if oxygen utilized during the transformation of metallic aluminum layer 36 (FIG. 1) to dielectric material 170 permeates the aluminum layer to interact with a silicon-comprising material 34 and oxidize an upper portion of the material. Such can occur if, for example, an aluminum oxide or aluminum oxynitride layer 170 is formed utilizing an implant of oxygen into metallic aluminum layer 36. In particular processing, silicon dioxide layer 172 will have a thickness of greater than 5 Å, and can, for example, have a thickness of about 10 Å. Also, dielectric material 170 can be formed to a thickness of, for example, from about 10 Å to about 40 Å, with an exemplary thickness being from about 10 Å to about 20 Å.

Figure 11:
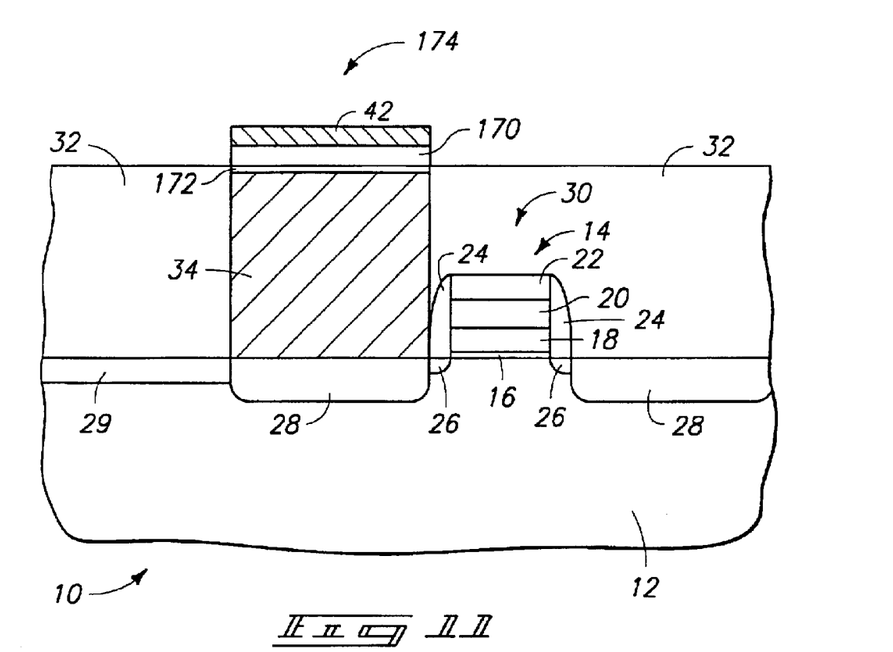
FIG. 11 is a view of the FIG. 1 wafer fragment shown at a processing step subsequent to that of FIG. 10 in accordance with the fifth embodiment method of the present invention.

Referring to FIG. 11, subsequent processing can be utilized to form a conductive material 42 over dielectric material 170, and accordingly to define a capacitor construction 174 comprising conductive material 42, dielectric materials 170 and 172, and conductive material 34. Capacitor construction 174 can be incorporated into a DRAM cell utilizing methodology similar to that discussed above with reference to FIG. 4.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming capacitor structures, comprising:
   forming a capacitor dielectric region over a first electrical node, the forming the capacitor dielectric region comprising:
      forming a layer of metallic aluminum over the first electrical node, the layer of metallic aluminum having a thickness less than 40 Å; and
      exposing the layer of metallic aluminum to one or both of O or N at a temperature less than 300° C. to form a dielectric material comprising aluminum and one or both of O and N; and
   forming a second electrical node over the dielectric region, the first electrical node, the capacitor dielectric region, and the second electrical node comprising a capacitor structure.

2. The method of claim 1 wherein the first electrical node comprises silicon and the dielectric material consists essentially of aluminum and one or both of O and N.

3. The method of claim 1 wherein the first electrical node comprises silicon and the dielectric material consists of aluminum and one or both of O and N.

4. The method of claim 1 wherein the forming the capacitor dielectric region further comprises, prior to forming the layer of metallic aluminum, forming a silicon dioxide-comprising layer over the first electrical node, wherein the capacitor dielectric region comprises the silicon dioxide-comprising layer and the dielectric material.

5. The method of claim 4 wherein the silicon dioxide-comprising layer is between the dielectric material and the first electrical node.

6. The method of claim 4 wherein the dielectric material physically contacts the silicon dioxide-comprising layer and the dielectric material consists essentially of aluminum and one or both of O and N.

7. The method of claim 4 wherein the dielectric material physically contacts the silicon dioxide-comprising layer and the dielectric material consists of aluminum and one or both of O and N.

8. The method of claim 1 wherein the forming the capacitor dielectric region further comprises, after forming the dielectric material:

forming another layer of metallic aluminum over the dielectric material; and exposing the other layer of metallic aluminum to O or N to form another dielectric material comprising one or both of O and N, wherein the dielectric materials have different compositions from one another.

9. The method of claim 8 wherein the dielectric material comprises aluminum nitride and the other dielectric material comprises aluminum oxide.

10. The method of claim 8 wherein each of the dielectric materials has a thickness of less than 20 Å.

11. A method of forming capacitor structures, comprising:

forming a capacitor dielectric region over a first electrical node, the forming the capacitor dielectric region comprising:

forming a layer of metallic aluminum over the first electrical node; and exposing the layer of metallic aluminum to one or both of O or N at a temperature less than 300° C. to form a dielectric material comprising aluminum and one or both of O and N; and forming a second electrical node over the dielectric region, the first electrical node, the capacitor dielectric region, and the second electrical node comprising a capacitor structure.

12. The method of claim 11 wherein the first electrical node comprises silicon and the dielectric material consists essentially of aluminum and one or both of O and N.

13. The method of claim 11 wherein the first electrical node comprises silicon and the dielectric material consists of aluminum and one or both of O and N.

14. The method of claim 11 wherein the forming the capacitor dielectric region further comprises, prior to forming the layer of metallic aluminum, forming a silicon dioxide-comprising layer over the first electrical node, wherein the capacitor dielectric region comprises the silicon dioxide-comprising layer and the dielectric material.

15. The method of claim 14 wherein the silicon dioxide-comprising layer is between the dielectric material and the first electrical node.

16. The method of claim 14 wherein the dielectric material physically contacts the silicon dioxide-comprising layer and the dielectric material consists essentially of aluminum and one or both of O and N.

17. The method of claim 14 wherein the dielectric material physically contacts the silicon dioxide-comprising layer and the dielectric material consists of aluminum and one or both of O and N.

18. The method of claim 11 wherein the forming the capacitor dielectric region further comprises, after forming the dielectric material:

forming another layer of metallic aluminum over the dielectric material; and exposing the other layer of metallic aluminum to O or N to form another dielectric material comprising one or both of O and N, wherein the dielectric materials have different compositions from one another.

19. The method of claim 18 wherein the dielectric material comprises aluminum nitride and the other dielectric material comprises aluminum oxide.

* * * * *